(12) United States Patent
Belot

(10) Patent No.: US 6,285,071 B1
(45) Date of Patent: Sep. 4, 2001

(54) SUBSTRATE-ON-INSULATOR SEMICONDUCTOR DEVICE WITH NOISE DECOUPLING

(75) Inventor: Didier Belot, Rives (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/466,728

(22) Filed: Dec. 17, 1999

(30) Foreign Application Priority Data

Dec. 17, 1998 (FR) .................................................. 98 15940

(51) Int. Cl.$^7$ ...................................................... H01L 29/00
(52) U.S. Cl. ........................ 257/532; 257/503; 257/531
(58) Field of Search .................................. 257/347, 350, 257/532, 531, 503

(56) References Cited

U.S. PATENT DOCUMENTS

| | | |
|---|---|---|
| 4,654,689 | * 3/1987 | Fujii . |
| 6,093,957 | * 7/2000 | Kwon ................................... 257/666 |
| 6,124,625 | * 9/2000 | Chern et al. .......................... 257/532 |

FOREIGN PATENT DOCUMENTS 2507 017A   12/1982 (FR) .

OTHER PUBLICATIONS

Ndagijimana, F, et al., "The Inductive Connection Effects of a Mounted SPDT in a Plastic SO8 Package", IEEE MTT-S International Microwave Symposium Digest, vol. 1, Jun. 14, 1993, pp. 91–94, XP000436344.

"Leadless Decoupling Capacitor Fabricated on Wafer Backside", IBM Technical Disclosure Bulletin, vol. 32, No. 3a, Aug. 1989, pp. 403–404, XP002110972.

Preliminary Search Report dated Aug. 2, 1999 with annex on French Application No. 9815940.

* cited by examiner

*Primary Examiner*—Ngân V. Ngô
(74) *Attorney, Agent, or Firm*—Theodore E. Galanthay; Stephen Bongini; Fleit, Kain, Gibbons, Gutman & Bongini P.L.

(57) ABSTRACT

A semiconductor device of the type having an integrated circuit with connection terminals connected to metal pads by connecting wires is provided. The integrated circuit includes a substrate-on-insulator type semiconductor substrate having a lower portion on top of which there is an upper insulating layer. A first semiconductor block and a second semiconductor block are produced in the upper insulating layer, and decoupling means are arranged in the upper insulating layer between the first and second semiconductor blocks. The first semiconductor block defines a first capacitor with the lower portion of the substrate, the second semiconductor block defines a second capacitor with the lower portion of the substrate, and the decoupling means includes at least one semiconductor well that defines a decoupling capacitor with the lower portion of the substrate. The capacitance of the decoupling capacitor is higher than the capacitance of each of the first and second capacitors. Also provided is a method of providing noise decoupling in an integrated circuit having a substrate-on-insulator type semiconductor substrate with a lower portion on top of which there is an upper insulating layer.

15 Claims, 3 Drawing Sheets

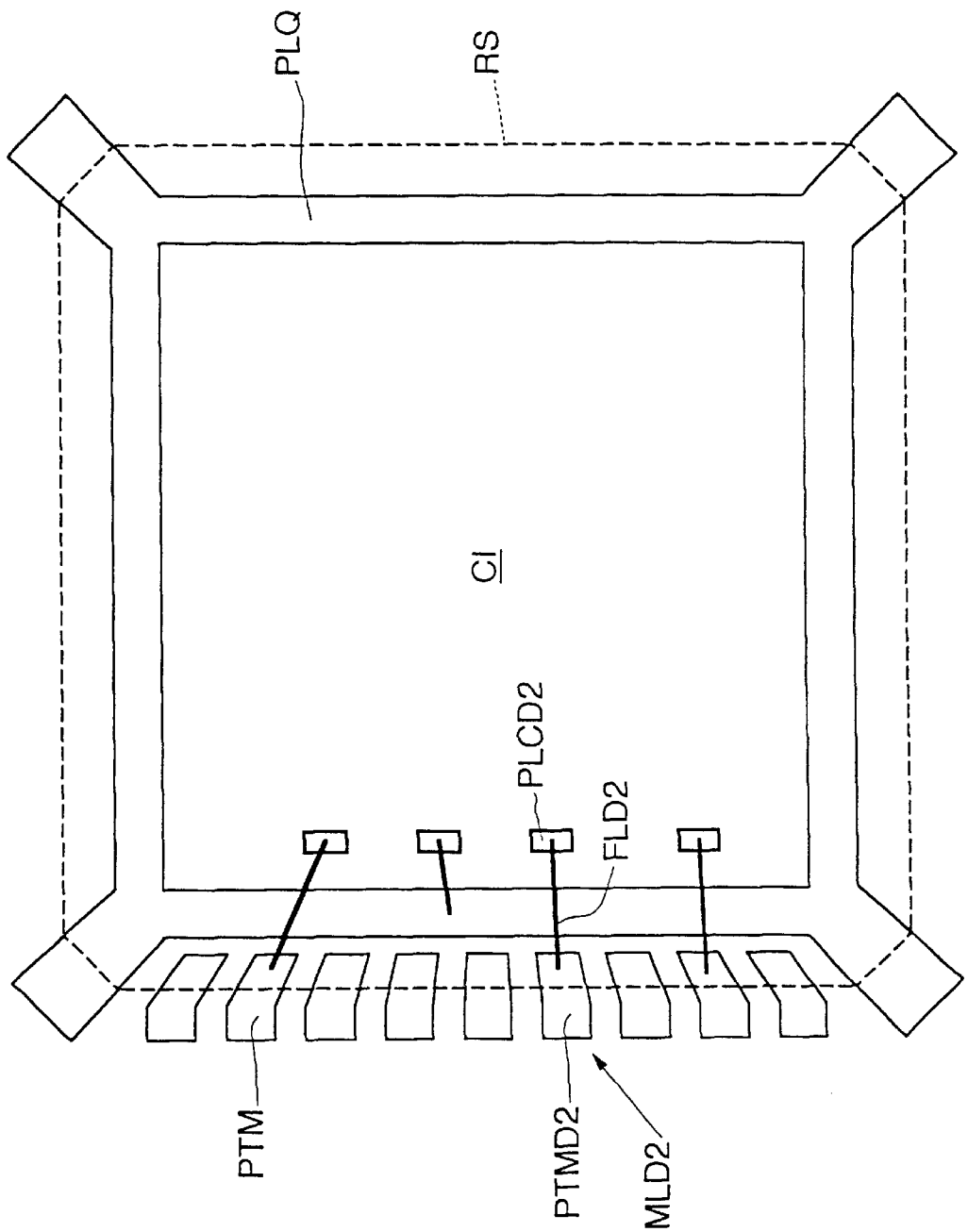

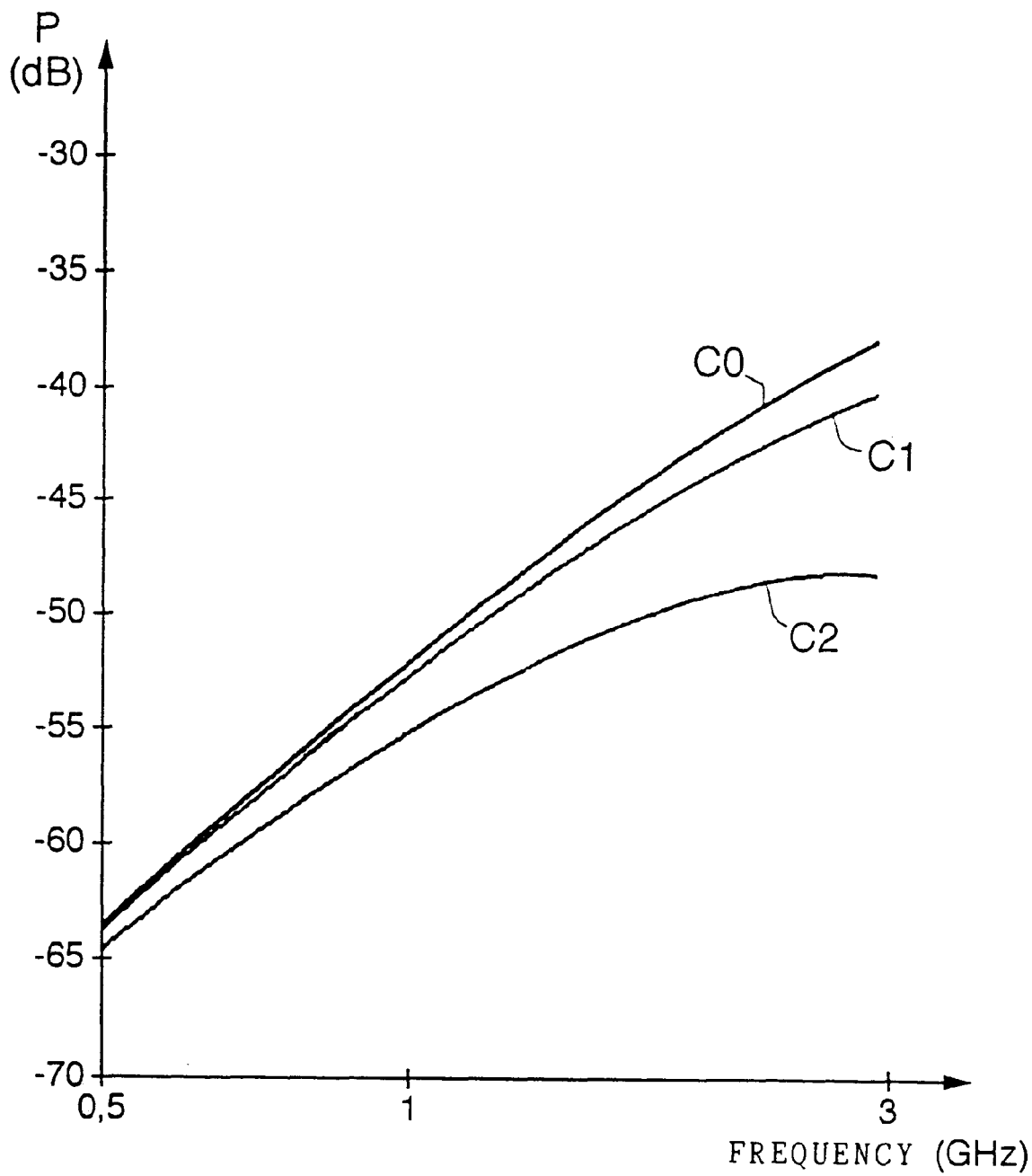

SUBSTRATE-ON-INSULATOR SEMICONDUCTOR DEVICE WITH NOISE DECOUPLING

CROSS-REFERENCE TO RELATED APPLICATIONS

This application is based upon and claims priority from prior French Patent Application No. 98-15940, filed Dec. 17, 1998, the entire disclosure of which is herein incorporated by reference.

BACKGROUND OF THE INVENTION

1. Field of the Invention

The present invention relates to semiconductor devices, and more specifically to decoupling between a noise emitter and a noise-sensitive receiver that are in an integrated circuit formed on a semiconductor-on-insulator type substrate.

2. Description of Related Art

The coupling noise in an integrated circuit essentially comes from two sources, namely the electromagnetic coupling due to the package and metal lines of the circuit and the electrical coupling due to the substrate (e.g., SOI substrate). The present invention is directed to reducing the electrical coupling noise due to the substrate. In particular, when a noise emitter injects charges into the substrate, the charges become distributed uniformly and then can be picked up by a receiver whose operation may be perturbed if it is sensitive to this electrical noise. For example, a "noise emitter" in the context of this description can be a strong-signal transistor that injects charges into the substrate, and the charges can be picked up by a weak-signal transistor, which then behaves as a noise-sensitive receiver. As an exemplary environment, such strong and weak-signal transistors can be incorporated into radio messaging receivers.

SUMMARY OF THE INVENTION

It is an object of the present invention to provide a noise emitter and a noise sensitive receiver within the same integrated circuit, while ensuring decoupling between the emitter and the receiver.

Another object of the present invention is to provide a noise emitter and a noise-sensitive receiver within the same integrated circuit, while ensuring decoupling, at high frequencies.

One embodiment of the present invention provides a semiconductor device of the type having an integrated circuit with connection terminals connected to metal pads by connecting wires. The integrated circuit includes a substrate-on-insulator type semiconductor substrate having a lower portion on top of which there is an upper insulating layer. A first semiconductor block and a second semiconductor block are produced in the upper insulating layer, and decoupling means are arranged in the upper insulating layer between the first and second semiconductor blocks. The first semiconductor block defines a first capacitor with the lower portion of the substrate, the second semiconductor block defines a second capacitor with the lower portion of the substrate, and the decoupling means includes at least one semiconductor well that defines a decoupling capacitor with the lower portion of the substrate. The capacitance of the decoupling capacitor is higher than the capacitance of each of the first and second capacitors. In a preferred embodiment, the first block is connected to an external ground via a first inductive link, the second block is connected to an external ground via a second inductive link, and the semiconductor well of the decoupling means is connected to an external ground via a decoupling inductive link whose inductive value is lower than the inductive value of each of the first and second inductive links.

Another embodiment of the present invention provides a method of providing noise decoupling in an integrated circuit having a substrate-on-insulator type semiconductor substrate with a lower portion on top of which there is an upper insulating layer. According to the method, a first semiconductor block and a second semiconductor block are produced in the upper insulating layer, with the first semiconductor block defining a first capacitor with the lower portion of the substrate and the second semiconductor block defining a second capacitor with the lower portion of the substrate. Decoupling means are produced in the upper insulating layer between the first and second semiconductor blocks. The decoupling means includes at least one semiconductor well that defines a decoupling capacitor with the lower portion of the substrate, and the capacitance of the decoupling capacitor is higher than the capacitance of each of the first and second capacitors.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 2 is a diagram illustrating the grounding of the decoupling means of FIG. 1; and FIG. 3 is a graph illustrating curves of noise rejection as a function of frequency.

DETAILED DESCRIPTION OF PREFERRED EMBODIMENTS

Figure 1:
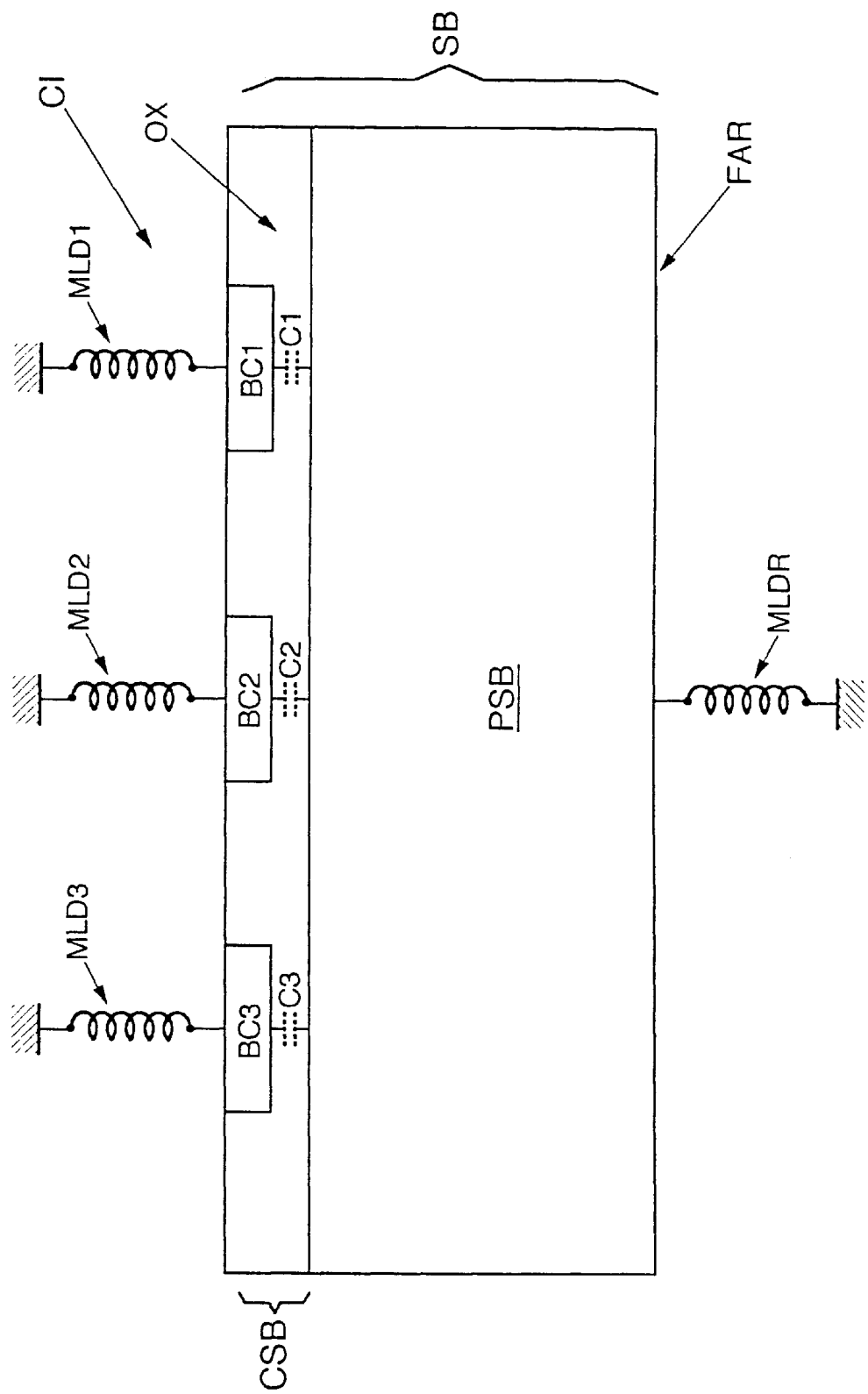
FIG. 1 is a diagram illustrating a portion of an integrated circuit equipped with decoupling means according to a preferred embodiment of the present invention.

Preferred embodiments of the present invention will be described in detail hereinbelow with reference to the attached drawings.

A preferred embodiment of the present invention provides a semiconductor device having, in resin encapsulation, an integrated circuit with connection terminals connected to metal pads by connecting wires. In general, the integrated circuit includes a semiconductor substrate of the substrate-on-insulator (SOI) type, having a lower part on top of which there is an upper insulating layer within which a "noise emitter" semiconductor block and a "noise-sensitive" semiconductor block are produced. (The term "block" is to be understood with a very general meaning in the context of the present invention. It may refer to a simple transistor or one or more functional blocks of a component that is produced within the integrated circuit.)

The emitter block defines a first capacitor with the lower part of the substrate, and the receiver semiconductor block defines a second capacitor with the lower part of the substrate. The integrated circuit also includes decoupling means that are arranged within the upper insulating layer between the two blocks. The decoupling means has at least one semiconductor well to define a "decoupling" capacitor with the lower part of the substrate, and the capacitance of the decoupling capacitor is higher than that of the first and second capacitors.

Thus, at high frequencies, the first and second capacitors have an low impedance compared with the resistivity of the substrate. The decoupling well (whose decoupling capacitor has a higher capacitance than the first and second capacitors) produces an even lower impedance path between the emitter and receiver. Thus, wide-band coupling is reduced. In other words, the charges injected into the substrate by the emitter block are trapped in a semiconductor well formed between the two blocks and having a well/substrate capacitance higher than the block/substrate capacitance of each of the emitter and receiver blocks.

It is particularly advantageous to not only trap the charges in the decoupling semiconductor well, but to also discharge them to ground. In preferred embodiments, when the emitter block is connected to an external ground via a first inductive link and the receiver block is connected to an external ground via a second inductive link, the decoupling well is connected to an external ground via a decoupling inductive link whose inductive value is lower than or equal to the inductive value of the first and second inductive links. Thus, there is produced a ground path with low impedance between the emitter and the receiver. The larger the well (i.e., the higher the capacitance of the decoupling capacitor), the better the isolation that is produced.

Preferably, the frequency of the signals processed by the receiver block should be lower than or equal to the resonant frequency of the capacitive-inductive decoupling means. More specifically, if the frequency of the signals processed by the receiver block exceeds the resonant frequency, the efficiency of the system drops because of the increase in the impedance of the decoupling inductive link, which becomes large compared with the impedance of the substrate. In other words, in such a case, this privileged path to ground is suppressed and the situation returns to that of an emitter causing noise interference in the receiver through the resistive-capacitive network of the substrate.

With this value constraint on the frequencies, wide-band decoupling is produced for signals whose frequency is lower than or equal to the resonant frequency of the decoupling means. If it is desired to produce narrow-band decoupling more particularly centered on a particular working frequency, the dimensions of the decoupling well can be adjusted so that the resonant frequency of the decoupling means corresponds to the chosen working frequency.

Accordingly, the present invention provides a radically different solution from the typical solution of moving the emitter as far away as possible from the receiver, which leads to the drawback of very large integrated circuits. By interposing a decoupling circuit between the emitter and the receiver, the present invention maintains the emitter-receiver spacing that was originally intended at the design stage. The present invention also avoids having to replace the lower part of the substrate which is generally a P-doped silicon substrate, with a substrate that is even more insulating (for example, based on glass) but which causes greater technical problems.

FIG. 1 shows a portion of an integrated circuit equipped with decoupling means according to a preferred embodiment of the present invention. As shown, the integrated circuit has a substrate SB of the substrate-on-insulator (SOI) type, which is characterized by islands of silicon (for example, blocks BC1, BC2, and BC3) that are spaced apart in a sea of oxide. The conventional fabrication process for such an SOI substrate integrated circuit begins with a silicon substrate PSB (for example, with a thickness of 350 microns and P-doped at $10^{14}$ to $10^{15}$ atoms/cm$^{-3}$) and then an upper layer of semiconductor wells is produced on the front face of the substrate PSB.

The wells, which here will subsequently form wells BC1, BC2, and BC3), rest on the upper face of the substrate PSB and are surrounded by an oxide region (for example, silicon dioxide) that also rests on the front face of the substrate PSB. The assembly is then cut level with the front face of the substrate PSB, and an oxide layer is grown on the front face of the substrate PSB. Then, the upper layer (including the semiconductor wells surrounded by oxide zones) is bonded to the upper face of this oxide layer to produce a substrate SB of the type shown in FIG. 1, which has an upper layer CSB that includes the oxide region OX within which the semiconductor wells of blocks BC1, BC2, and BC3 are embedded.

The presence of oxide region OX between each well BC and the lower part PSB of the substrate forms the dielectric of a well/substrate capacitor C. The capacitance of this capacitor C is proportional to the area of the lower face of the well opposite the lower part PSB of the substrate. More precisely, the capacitance is equal to the product of the dielectric constant of the oxide multiplied by the area of the well opposite the lower part PSB of the substrate, all divided by the thickness of oxide between the well and the lower part of the substrate.

In the illustrative embodiment of FIG. 1, it is assumed that the third block BC3 emits noise into the lower part PSB of the substrate. For example, the third block BC3 can have one or more strong-signal transistors that process signals having a power on the order of one watt. Furthermore, it is assumed that the first block BC1 has noise-sensitive elements such as weak-signal transistors that process signals having a power on the order of one nanowatt or a few tens of nanowatts. At very low frequencies, the original electrical coupling between the emitter block BC3 and the receiver block BC1 is very weak because of the presence of the capacitors C1 and C3, which thus behave as an anti-noise barrier.

Furthermore, the rear face FAR of the substrate is typically grounded via an inductive connection means MLDR. More specifically, the integrated circuit conventionally rests on a central plate PLQ of a connection grid that has metal connection pads PTM, as shown in FIG. 2. The assembly is held in resin encapsulation RS, and connection terminals are formed on the surface of the integrated circuit and connected by vias (metal interconnection holes) to the various active components of the integrated circuit.

These various connection terminals can be connected to either the central plate PLQ or directly to the metal pads PTM via welded connecting wires. The connecting wires and the associated metal connection pads form the inductive connection means, whose inductance value can be known to within a percentage. For example, the inductive value of link MLDR (wire and metal pad) is on the order of 5 nanohenries, and this is generally also the value of the inductive connection means MLD3 and MLD1 that ground blocks BC3 and BC1, respectively. The rear-face contact contributes to reducing the coupling at low frequencies.

When the frequency rises and increases to a high frequency (typically of several hundred MHz or more), the impedance of the inductive link MLDR increases so as to suppress this privileged path to ground for discharging the noise electric charges. Thus, the situation returns to being that of an emitter that causes noise interference on the receiver through the resistive-capacitive network of the lower part PSB of the substrate. However, this problem of high-frequency decoupling is overcome by interposing a decoupling semiconductor well BC2 between the first and third blocks BC1 and BC3. The decoupling semiconductor well BC2 has a well/substrate capacitance C2 and is connected to ground through a connecting means MLD2 (e.g., pad PTMD2 and wire FLD2 connecting to terminal PLCD2).

The present invention provides the decoupling semiconductor well because, at high frequencies, the well/substrate capacitors have an impedance that becomes small compared with the resistivity of the substrate. By choosing the capacitance of capacitor C2 to be higher than both the capacitance of capacitor C3 and the capacitance of capacitor C1, a low-impedance path is created between the emitter block BC3 and the receiver block BC1. Therefore, the charges injected into the lower part of the substrate PSB by the emitter will naturally be channeled into the decoupling well BC2.

Furthermore, it is particularly advantageous to remove these charges to ground through connecting means MLD2, the inductive value L2 of which is advantageously chosen to be lower than or equal to the inductive values L1 and L3 of blocks BC1 and BC3. This reduces the impedance to ground at high frequencies. It should be noted that the "ground" can be a "dynamic ground" (i.e., a fairly wide supply plane in relation to a ground plane between which a short-circuit is created at high frequencies).

The larger the well, the better the isolation that is produced. In general, wideband decoupling of the substrate is produced for signal frequencies lower than or equal to the resonant frequency of the inductive-capacitive resonant circuit formed by capacitor C2 and inductive link MLD2. More specifically, if the frequency of the signals to be processed exceeds the resonant frequency, the impedance of inductive link MLD2 will increase and become large compared with the resistance of the substrate. The situation will then again return to that of an emitter that causes noise interference on the receiver through the resistive-capacitive network of the substrate. In other words, the structure of the present invention allows wide-band decoupling of the substrate for frequencies lower than or equal to $1/4\pi^2 L2C2$.

FIG. 3 is a graph illustrating a comparison between: an integrated circuit with no decoupling well, in which the emitter and the receiver are 100 microns apart C0; an integrated circuit with a 10 micron wide decoupling well, and an emitter/receiver spacing of 100 microns C1; and an integrated circuit with a 90 micron wide decoupling well and an emitter/receiver spacing of 100 microns C2. The efficiency of the decoupling means at high frequencies (e.g., above a frequency of one gigahertz) can be seen in FIG. 3. At low frequencies (e.g., at 500 MHz), the coupling noise is essentially discharged via the rear face of the substrate because the impedance of the substrate is smaller.

While there has been illustrated and described what are presently considered to be preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims

What is claimed is:

1. A semiconductor device of the type having an integrated circuit with connection terminals connected to metal pads by connecting wires, said integrated circuit comprising:

a substrate-on-insulator type semiconductor substrate having a lower portion on top of which there is an upper insulating layer, wherein a first semiconductor block and a second semiconductor block are produced in the upper insulating layer, the first semiconductor block defining a first capacitor with the lower portion of the substrate and the second semiconductor block defining a second capacitor with the lower portion of the substrate, decoupling means are arranged in the upper insulating layer between the first and second semiconductor blocks, the decoupling means including at least one semiconductor well that defines a decoupling capacitor with the lower portion of the substrate, and the capacitance of the decoupling capacitor is higher than the capacitance of each of the first and second capacitors.

2. The semiconductor device as defined in claim 1, wherein the first block is connected to an external ground via a first inductive link, and the second block is connected to an external ground via a second inductive link.

3. The semiconductor device as defined in claim 2, wherein the semiconductor well of the decoupling means is connected to an external ground via a decoupling inductive link whose inductive value is lower than the inductive value of each of the first and second inductive links.

4. The semiconductor device as defined in claim 3, wherein a rear face of the substrate is connected to an external ground via an inductive connection means.

5. The semiconductor device as defined in claim 3, wherein the resonant frequency of the decoupling means is higher than the frequency of signals processed by the second block.

6. A communication apparatus including at least one integrated circuit, said integrated circuit comprising:

a substrate-on-insulator type semiconductor substrate having a lower portion on top of which there is an upper insulating layer, wherein a first semiconductor block and a second semiconductor block are produced in the upper insulating layer, the first semiconductor block defining a first capacitor with the lower portion of the substrate and the second semiconductor block defining a second capacitor with the lower portion of the substrate, decoupling means are arranged in the upper insulating layer between the first and second semiconductor blocks, the decoupling means including at least one semiconductor well that defines a decoupling capacitor with the lower portion of the substrate, and the capacitance of the decoupling capacitor is higher than the capacitance of each of the first and second capacitors.

7. The communication apparatus as defined in claim 6, wherein the first block is connected to an external ground via a first inductive link, and the second block is connected to an external ground via a second inductive link.

8. The communication apparatus as defined in claim 7, wherein the semiconductor well of the decoupling means is connected to an external ground via a decoupling inductive link whose inductive value is lower than the inductive value of each of the first and second inductive links.

9. The communication apparatus as defined in claim 8, wherein a rear face of the substrate is connected to an external ground via an inductive connection means.

10. The communication apparatus as defined in claim 8, wherein the resonant frequency of the decoupling means is higher than the frequency of signals processed by the second block.

11. A method of providing noise decoupling in an integrated circuit having a substrate-on-insulator type semiconductor substrate with a lower portion on top of which there is an upper insulating layer, said method comprising the steps of:

producing a first semiconductor block and a second semiconductor block in the upper insulating layer, the first semiconductor block defining a first capacitor with the lower portion of the substrate and the second semiconductor block defining a second capacitor with the lower portion of the substrate; and producing decoupling means in the upper insulating layer between the first and second semiconductor blocks, the decoupling means including at least one semiconductor well that defines a decoupling capacitor with the lower portion of the substrate, wherein the capacitance of the decoupling capacitor is higher than the capacitance of each of the first and second capacitors.

12. The method as defined in claim 11, further comprising the steps of:

connecting the first block to an external ground via a first inductive link; and connecting the second block to an external ground via a second inductive link.

13. The method as defined in claim 12, further comprising the step of connecting the semiconductor well of the decoupling means to an external ground via a decoupling inductive link whose inductive value is lower than the inductive value of each of the first and second inductive links.

14. The method as defined in claim 13, further comprising the step of connecting a rear face of the substrate to an external ground via an inductive connection means.

15. The method as defined in claim 13, wherein the resonant frequency of the decoupling means is higher than the frequency of signals processed by the second block.

* * * * *